US010361096B2

(12) United States Patent
Plappert et al.

(10) Patent No.: US 10,361,096 B2
(45) Date of Patent: Jul. 23, 2019

(54) SEMICONDUCTOR COMPONENT, METHOD FOR PROCESSING A SUBSTRATE AND METHOD FOR PRODUCING A SEMICONDUCTOR COMPONENT

(71) Applicant: Infineon Technologies AG, Neubiberg (DE)

(72) Inventors: Mathias Plappert, Drobollach (AT); Stefan Krivec, Arnoldstein (AT); Andreas Riegler, Lichtpold (AT); Karin Schrettlinger, Trebesing (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/677,091

(22) Filed: Aug. 15, 2017

(65) Prior Publication Data
US 2018/0053663 A1 Feb. 22, 2018

(30) Foreign Application Priority Data

Aug. 16, 2016 (DE) .................. 10 2016 115 174

(51) Int. Cl.
*H01L 21/3215* (2006.01)
*H01L 23/00* (2006.01)
(Continued)

(52) U.S. Cl.
CPC .. *H01L 21/32155* (2013.01); *H01L 21/76886* (2013.01); *H01L 23/293* (2013.01); *H01L 23/298* (2013.01); *H01L 23/3171* (2013.01); *H01L 23/3192* (2013.01); *H01L 24/03* (2013.01); *H01L 29/0619* (2013.01);
(Continued)

(58) Field of Classification Search
CPC ............ H01L 21/32155; H01L 23/293; H01L 23/298; H01L 23/3171; H01L 23/3192; H01L 29/0619; H01L 29/66425; H01L 29/7393
See application file for complete search history.

(56) References Cited

U.S. PATENT DOCUMENTS 4,924,294 A * 5/1990 Tanielian .......... H01L 21/76889
257/749
6,060,392 A * 5/2000 Essaian ............. H01L 21/28052
257/E21.165
(Continued)

FOREIGN PATENT DOCUMENTS

DE 19904065 A1 8/1999

*Primary Examiner* — Cheung Lee
*Assistant Examiner* — Stephen C Smith
(74) *Attorney, Agent, or Firm* — Viering, Jentschura & Partner MBB

(57) ABSTRACT

In various embodiments, a method is provided. The method includes forming a metallization layer above at least one first region of a substrate. After forming the metallization layer at least one second region of the substrate is free of the metallization layer. The method further includes forming a barrier layer above the at least one first region of the substrate and above the at least one second region of the substrate. The barrier layer in the at least one first region of the substrate directly adjoins the metallization layer. The method further includes removing the barrier layer in the at least one first region of the substrate by drive-in of the barrier layer into the metallization layer.

15 Claims, 8 Drawing Sheets

(51) Int. Cl.

| | | |
|---|---|---|
| *H01L 21/768* | (2006.01) | |
| *H01L 23/31* | (2006.01) | |
| *H01L 23/29* | (2006.01) | |
| *H01L 29/66* | (2006.01) | |
| *H01L 29/739* | (2006.01) | |
| *H01L 29/40* | (2006.01) | |
| *H01L 29/06* | (2006.01) | |
| H01L 29/417 | (2006.01) | |
| H01L 29/74 | (2006.01) | |

(52) U.S. Cl.
CPC ...... *H01L 29/401* (2013.01); *H01L 29/66325* (2013.01); *H01L 29/7393* (2013.01); *H01L 29/417* (2013.01); H01L 29/41716 (2013.01); H01L 29/7436 (2013.01)

(56) References Cited

U.S. PATENT DOCUMENTS

| | | | |
|---|---|---|---|
| 6,525,389 B1 * | 2/2003 | Ahmed | H01L 21/765 257/481 |
| 2006/0086939 A1 | 4/2006 | Carta et al. | |
| 2013/0244371 A1 * | 9/2013 | Sewell | H01L 31/022441 438/96 |
| 2014/0061733 A1 | 3/2014 | Schmidt et al. | |

* cited by examiner

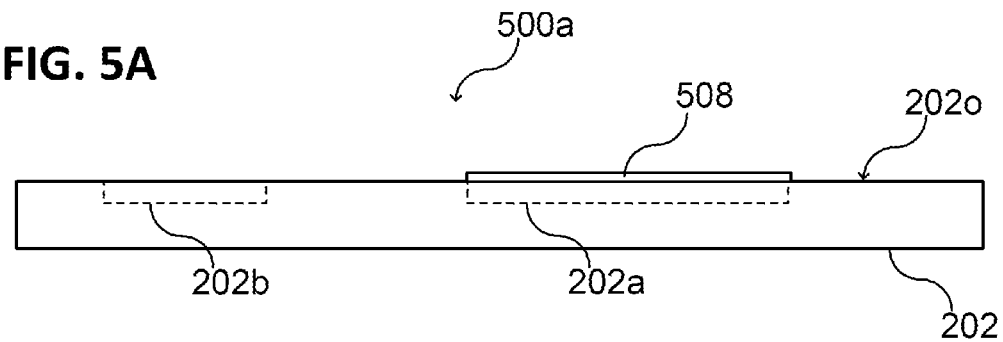
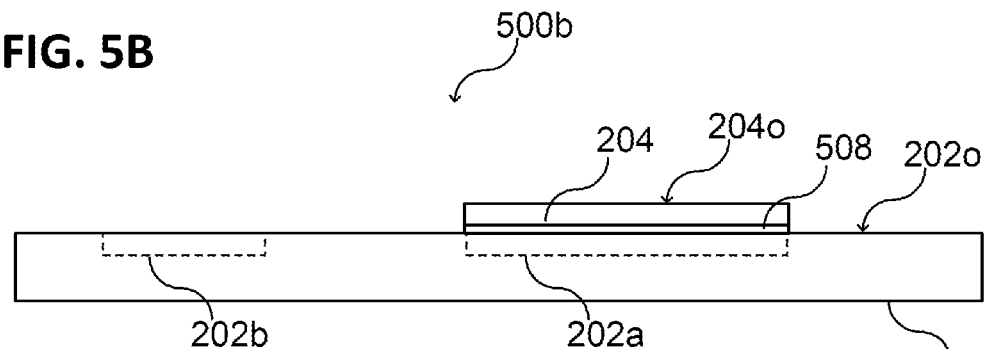
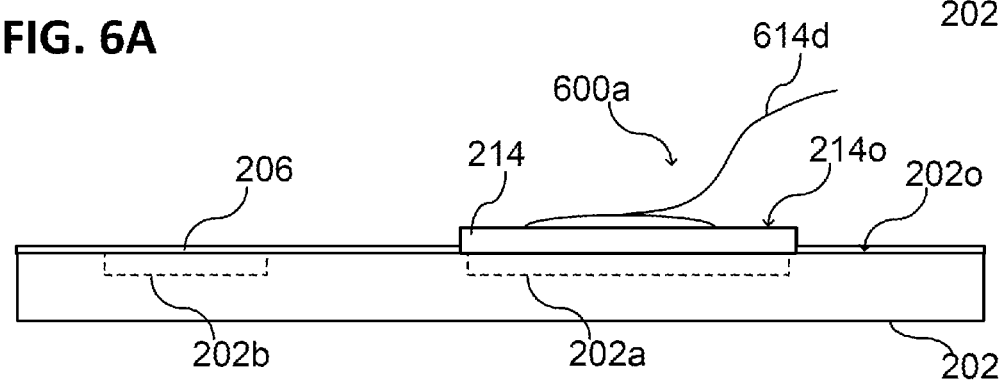
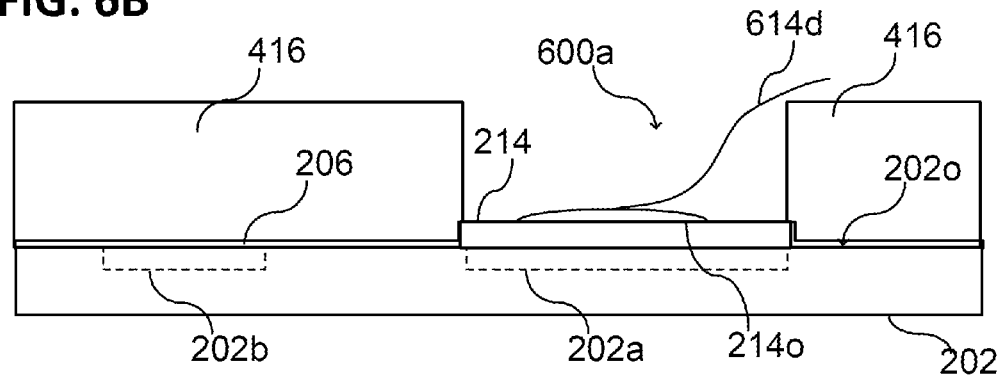

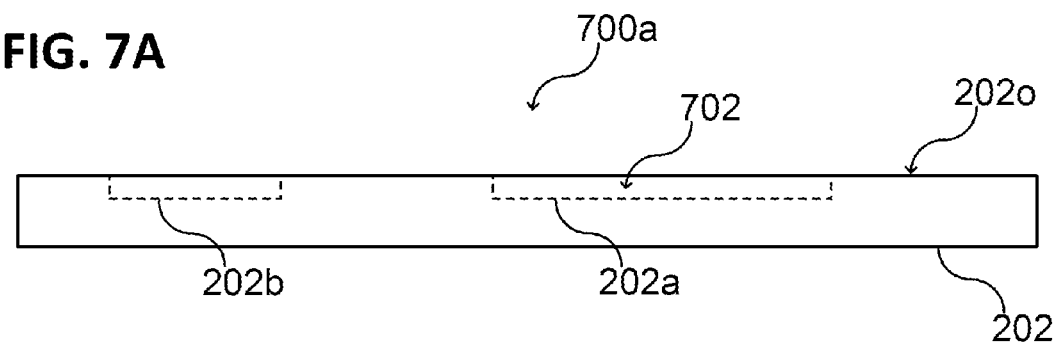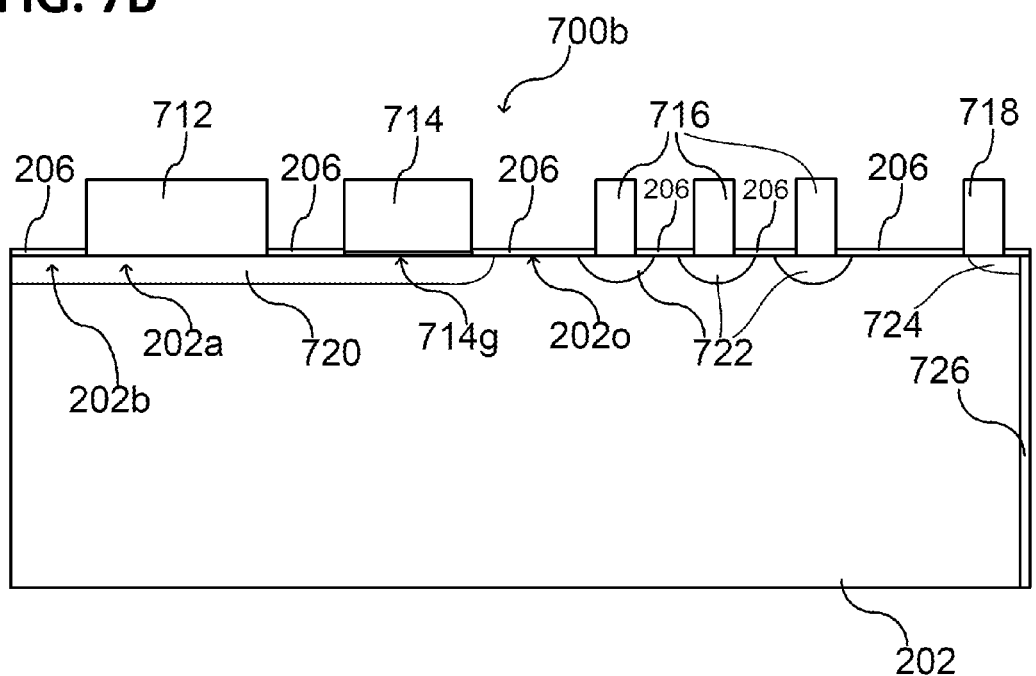

SEMICONDUCTOR COMPONENT, METHOD FOR PROCESSING A SUBSTRATE AND METHOD FOR PRODUCING A SEMICONDUCTOR COMPONENT

CROSS-REFERENCE TO RELATED APPLICATION

This application claims priority to German Patent Application Serial No. 10 2016 115 174.2, which was filed Aug. 16, 2016, and is incorporated herein by reference in its entirety.

TECHNICAL FIELD

Various embodiments relate generally to a semiconductor component, a method for processing a substrate and a method for producing a semiconductor component.

BACKGROUND

Semiconductor components, e.g. diodes, transistors, thyristors, etc. in semiconductor technology are conventionally produced by means of fundamental processes based essentially on a sequence of layering and patterning and additionally on doping and annealing. It can be difficult here to choose suitable materials for the structures of a semiconductor component that are respectively to be produced, or to find suitable material combinations for the respective processes, such that the semiconductor component satisfies the respective requirements. During the processing of a semiconductor component, besides the electrical properties to be achieved, for example, further requirements may also be relevant, such as, for example, said component's fail-safety, price, or else generally the process yield of the production process.

Conventionally, during the processing of a semiconductor component, a layer can be wholly or partly removed by means of etching. This can be effected for example by means of wet-chemical etching, reactive ion etching, etc. In this case, however, the respectively remaining surface of a layer after etching may be rough or have etching damage (e.g. undesired etching pits). Various embodiments are based, for example, on providing a process sequence for partly or completely removing a layer, which process sequence does not require an etching method for removing the layer.

Conventionally, during the processing of a semiconductor component, a layer can be partly removed, e.g. patterned, by said layer being covered by means of a patterned mask, for example, and then being partly removed by means of etching in accordance with the patterned mask. A patterned mask (e.g. hard mask or resist mask) can be produced by means of photolithography. Various embodiments are based, for example, on providing a process sequence for partly removing a layer, which process sequence does not require an etching method for removing the layer and is simultaneously self-aligning (that is to say that said process sequence does not require a patterned mask for partly removing the layer).

SUMMARY

In various embodiments, a method is provided. The method includes forming a metallization layer above at least one first region of a substrate. After forming the metallization layer at least one second region of the substrate is free of the metallization layer. The method further includes forming a barrier layer above the at least one first region of the substrate and above the at least one second region of the substrate. The barrier layer in the at least one first region of the substrate directly adjoins the metallization layer. The method further includes removing the barrier layer in the at least one first region of the substrate by drive-in of the barrier layer into the metallization layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 5A and 5B show in each case a schematic view of a substrate during the processing, in accordance with various embodiments;

FIGS. 6A and 6B show in each case a schematic view of a substrate during the processing, in accordance with various embodiments;

FIGS. 7A and 7B show in each case a schematic view of a substrate during the processing, in accordance with various embodiments.

DESCRIPTION

Figure 1:
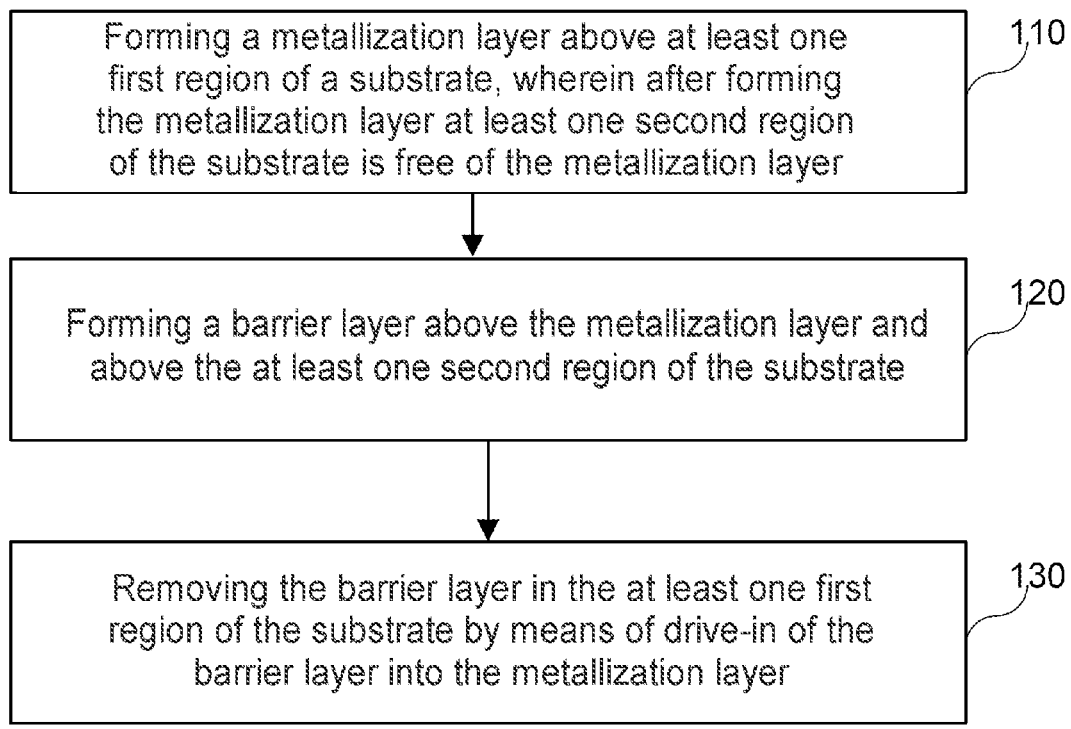
FIG. 1 shows a schematic flow diagram of a method for processing a substrate, in accordance with various embodiments.

The following detailed description refers to the accompanying drawings that show, by way of illustration, specific details and embodiments in which the invention may be practiced.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In accordance with various embodiments, a method is provided for processing a substrate, and respectively for producing a component, wherein the substrate can be e.g. a semiconductor substrate, and the component a semiconductor component. In accordance with various embodiments, the method can be used for producing a power semiconductor component. Alternatively, the method can be used for producing logic components, a memory component or the like.

For power semiconductor components it may be necessary or helpful to use a passivation for the edge termination. The so-called edge termination can be a structure that reduces the electric field at the edge of a p-n junction. In this case, by way of example, polyimide can function as passivation in combination with the function of removing the electric field strength to below the characteristic breakdown voltage of the packaging materials used. By way of example, it is possible to use silicone in modules as packaging material.

With the use of a polyimide passivation layer for passivating a substrate, it is possible to arrange an adhesion promoting layer between the substrate and the polyimide passivation layer, e.g. a silicon nitride layer and/or a silicon oxide layer. The adhesion promoting layer can conventionally be patterned for example by means of a resist (e.g. by means of the polyimide itself or some other resist), e.g. by means of plasma etching.

Depending on the passivation layer respectively used (e.g. also in the form of a layer stack) and the thickness thereof, it may be necessary to remove a polymer layer separately by means of an additional process (resist and residue removal by means of EKC).

Furthermore, alternative materials are being investigated, with the aim of replacing polyimide as passivation layer (e.g. by using silicones), wherein an adhesion promoting layer may be necessary or helpful in such cases too. For materials having a comparatively low photosensitivity, a correspondingly high radiation dose may be required for exposure (during a lithography process), such that for example an antireflection layer may also be necessary or helpful in order to avoid or reduce exposure errors.

Besides the static performance, the passivation layers can influence the reliability of the component; e.g. drifts can occur in the HTRB/$H^3$TRB tests (High Temperature Reverse Bias (HTRB) and High Humidity High Temperature Reverse Bias ($H^3$TRB)), e.g. caused on account of mobile ions generated, which can influence the electric field distribution at the edge termination.

A description is given below of a method which makes it possible to avoid separate patterning of a layer (e.g. of an adhesion promoting layer arrangement below a passivation layer). A metallization is uncovered at the desired locations and regions alongside the metallization (e.g. in the region of the edge termination) are covered with the passivation layer. Instead of patterning (i.e. partly removing) the layer, the latter, in accordance with various embodiments, can be partly driven into the metallization.

In this case, the layer used is an a-Si layer, for example, wherein a-Si denotes amorphous silicon. Amorphous silicon is electrically insulating in contrast to monocrystalline or polycrystalline silicon. The a-Si layer can function as a sealing layer (designated herein as barrier layer) for example before the drive-in. Consequently, by way of example, it is subsequently possible to support a surface-sensitive process, e.g. so-called electroless (e-less) plating. Furthermore, the sealing layer (designated herein as barrier layer) can function as an antireflection layer and/or as an adhesion promoting layer between the substrate and a passivation layer (e.g. an imide layer or silicone layer).

In accordance with various embodiments, a layer in the region in which said layer adjoins a metal layer is driven into the metal layer. By way of example, an a-Si layer can be driven into an aluminium layer, wherein the ratio of the aluminium layer to the a-Si layer can be adapted to a predefined process temperature, in order to achieve the doping of the aluminium during the process.

In accordance with various embodiments, an aluminium layer can also include a small amount of copper (e.g. less than one percent by mass), which is designated for example as AlCu.

FIG. 1 illustrates a method 100 in a schematic flow diagram, in accordance with various embodiments. The method can for example include the processing of a substrate and be part of a production method for producing a semiconductor component.

The method 100 can for example include, in 110: forming a metallization layer above at least one first region of a substrate. After forming the metallization layer at least one second region of the substrate is free of the metallization layer. Furthermore, the method 100 can for example include, in 120: forming a barrier layer above the metallization layer and above the at least one second region of the substrate. Furthermore, the method 100 can for example include, in 130: removing the barrier layer in the at least one first region of the substrate by means of drive-in of the barrier layer into the metallization layer. The layer designated herein as barrier layer can also be understood as an auxiliary layer, a protection layer, a passivation layer, a sealing layer, or the like.

The drive-in of the barrier layer into the metallization layer can be effected by means of an annealing process, for example. In this case, a predefined minimum temperature may be necessary in order to drive the material of the barrier layer into the material of the metallization layer. The minimum temperature can be defined by the materials respectively used. If, for example, the barrier layer includes silicon and the metallization layer includes aluminium, the silicon can be driven into the aluminium; e.g. the silicon can be dissolved in the aluminium, be mixed with the aluminium or be embedded in the aluminium.

The drive-in of silicon into aluminium can be effected for example at a temperature of more than 100° C., e.g. at more than 150° C., more than 200° C., or more than 250° C. In this case, the drive-in can be effected in such a way that the metallization layer is not completely melted, since the latter may otherwise be damaged or destroyed for example. If the metallization layer includes or essentially consists of aluminium, it is possible for example to carry out the annealing process at a temperature of less than 550° C., e.g. less than 500° C. In accordance with various embodiments, the annealing process can be effected at a temperature in a range of approximately 200° C. to approximately 550° C., e.g. in a range of approximately 250° C. to approximately 450° C.

For the drive-in of the barrier layer into the metallization layer, these layers can be heated by means of a furnace process or by means of irradiation (e.g. by means of a laser or halogen lamps). The annealing process can be rapid thermal processing (designated as RTP), e.g. with a heating rate of more than 50 K per second (e.g. more than 100 K per second) and a cooling rate of more than 10 K per second (e.g. more than 20 K per second).

In accordance with various embodiments, the drive-in or the annealing process can be carried out in a vacuum, e.g. at a pressure of less than 1 mbar. Alternatively, the drive-in or the annealing process can be effected under a protective gas atmosphere, e.g. in a nitrogen, helium and/or argon atmosphere.

The method is described below at various points on the basis of a barrier layer composed of amorphous silicon and a metallization layer composed of aluminium. However, any other suitable material combinations can be used for the two layers in an analogous manner. Suitable material combinations can be selected for example from the following standpoints.

Since the material of the barrier layer, in accordance with various embodiments, is not intended to mix with the metallization layer as early as during the formation of the barrier layer, firstly it is possible to determine a limit temperature above which the material of the barrier layer mixes with the material of the metallization layer and below which the material of the barrier layer does not mix with the material of the metallization layer. This can be effected for example on the basis of a chemical phase diagram or on the basis of insights gained empirically. The barrier layer can be formed at a temperature which is lower than the limit temperature. Only when the barrier layer is intended to be driven into the metallization layer is it possible for the two layers to be heated to a temperature which is greater than the limit temperature.

By way of example, a chemical vapour deposition or a physical vapour deposition can be used for forming the barrier layer, for example also in a manner dependent on the limit temperature.

The deposition of a layer essentially consisting of amorphous silicon can be effected for example by means of sputter layering (also referred to as cathode sputtering), for example by means of magnetron sputtering. In this case, the deposition can be effected at a deposition temperature of less than 200° C. Furthermore, the deposition can be effected in a hydrogen-containing atmosphere. Furthermore, the deposition of a layer essentially consisting of amorphous silicon can be effected by means of plasma-enhanced chemical vapour deposition (PECVD) at a deposition temperature of less than 200° C.

The deposition temperature can be for example the temperature to which the substrate respectively to be layered is heated during the deposition process.

In accordance with various embodiments, the a-Si layer deposited by means of chemical vapour deposition (CVD) or physical vapour deposition (PVD) can have an electrical resistivity of more than $1 \cdot 10^9$ Ωcm, e.g. more than $1 \cdot 10^{10}$ Ωcm. Illustratively, the deposition is effected in such a way that the layer formed is electrically insulating.

The deposition of an aluminium-containing metallization layer can be effected for example by means of chemical vapour deposition (CVD) or physical vapour deposition (PVD), e.g. by means of PECVD, sputter layering, or electrodeposition.

In accordance with various embodiments, the barrier layer can have a layer thickness which is less than the layer thickness of the metallization layer. It is thus possible to ensure, for example, that the entire barrier layer can be completely driven into the metallization layer. Furthermore, it may be helpful if the metallization layer is still electrically conductive after the drive-in of the barrier layer into the metallization layer. Illustratively, the electrical properties of the metallization layer are intended not to be altered, or to be altered only insignificantly, upon the drive-in of the material of the barrier layer.

In accordance with various embodiments, the barrier layer can have a layer thickness of less than 100 nm, e.g. less than 50 nm, e.g. a layer thickness in a range of approximately 2 nm to approximately 100 nm. Forming a barrier layer composed, for example, of amorphous silicon having a layer thickness in a range of approximately 2 nm to approximately 100 nm can furthermore make it possible, for example, to use said barrier layer as an antireflection layer. Consequently, by way of example, a passivation layer (e.g. a polyimide passivation layer or any other polymer passivation layer) which is arranged on the barrier layer can be exposed with high accuracy and thus patterned with high accuracy by means of a photolithographic process.

FIG. 2A to FIG. 2D illustrate in each case a schematic side view or cross-sectional view of a substrate at different points in time $200a$, $200b$, $200c$, $200d$ during the processing, e.g. during the method 100 in accordance with various embodiments. In this case, it may be possible to alter the process order if in doing so the same result is achieved.

Figure 2A:
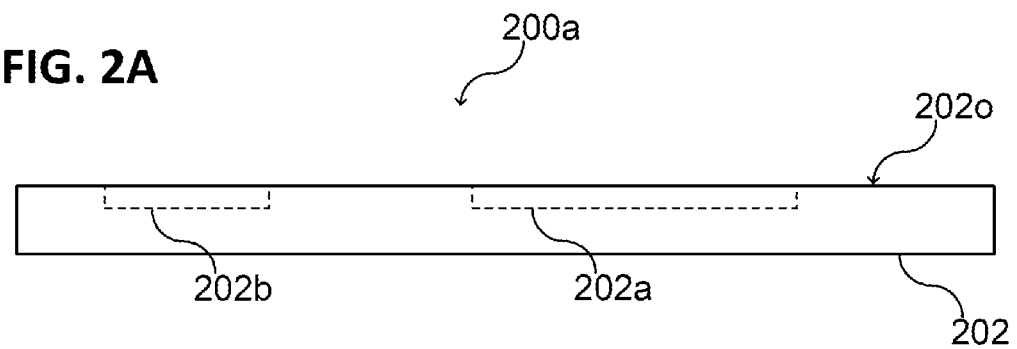
FIGS. 2A to 2D show in each case a schematic view of a substrate during the processing, in accordance with various embodiments.

FIG. 2A illustrates a substrate 202 at a first point in time $200a$, e.g. at the beginning of the method 100. The substrate 202 may include a surface $202o$ to be processed. The substrate 202 can be for example a semiconductor substrate, e.g. a silicon wafer or silicon chip, or any other suitable substrate which can be used for example in the semiconductor industry, e.g. including or consisting of SiC, GaAs, GaN or the like.

Without restricting the generality, the substrate 202 may include a first region $202a$ and a second region $202b$. The regions $202a$, $202b$ of the substrate 202 can be defined for example by at least one semiconductor structure which is formed (not illustrated) or is intended to be formed in and/or on the substrate 202 (cf. FIG. 7B).

Figure 2B:
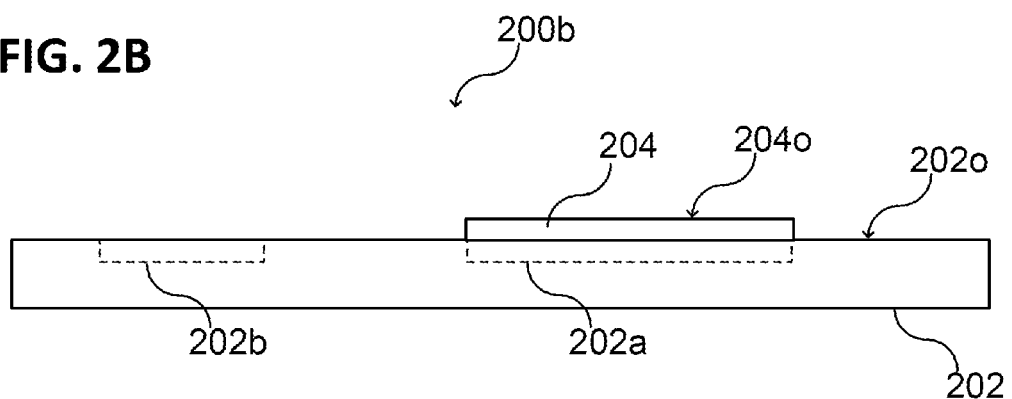

FIG. 2B illustrates the substrate 202 after the process of forming a metallization layer 204 above the first region $202a$ of the substrate 202, in accordance with various embodiments. In this case, the metallization layer 204 can electrically contact a structure in and/or on the substrate 202. It goes without saying that the metallization layer 204 includes an electrically conductive material, e.g. aluminium or an aluminium/copper alloy, or that the metallization layer 204 is electrically conductive. The metallization layer 204 can have for example an electrical conductivity (measured at 25° C.) of more than $10^6$ S/m.

In accordance with various embodiments, the metallization layer 204 can partly or completely cover the first region $202a$ of the substrate 202. In this case, the second region $202b$ of the substrate 202 can be partly or completely free of the metallization layer 204. The metallization layer 204 can be patterned, for example. In this case, the metallization layer 204 can be formed, e.g. deposited selectively, in such a way that it is arranged only above the first region $202a$. Furthermore, the metallization layer 204 can be deposited above the entire surface $202o$ of the substrate 202 and be partly removed again, such that the second region is at least partly free of the metallization layer 204.

The term "free of" used herein in relation to the second region, which is free of the metallization layer 204, can be understood such that the metallization layer 204 has no direct contact with the substrate 202 in the second region, and/or that the metallization layer 204 does not laterally overlap the substrate in the second region.

Figure 2C:
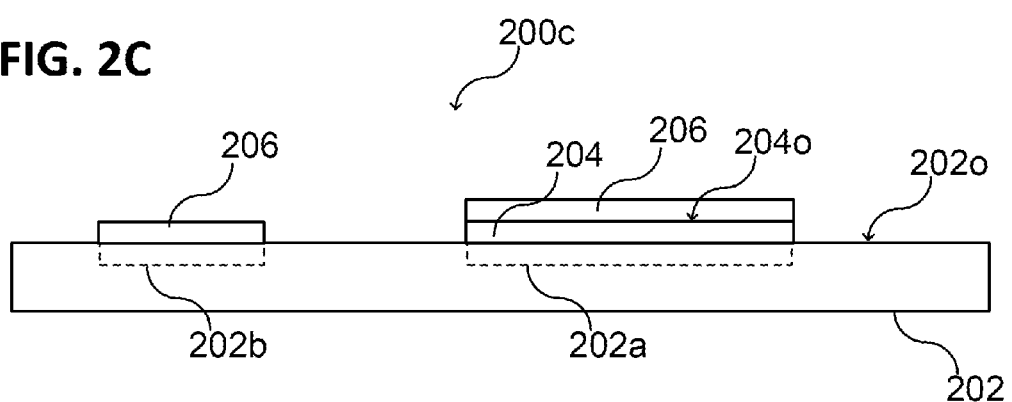

FIG. 2C illustrates the substrate 202 after the process of forming a metallization layer 204 above the first region $202a$ of the substrate 202 and after the process of forming a barrier layer 206 above the metallization layer 204 and above the at least one second region 202b of the substrate 202, in accordance with various embodiments.

In this case, the barrier layer 206 can have a direct physical contact with the metallization layer 204, such that the barrier layer 206 can be driven into the metallization layer 204. The barrier layer 206, after the formation thereof, is substantially separate from the metallization layer 204, i.e. not mixed therewith. In the second region 202b, the barrier layer 206 can be formed directly on the substrate 202.

In accordance with various embodiments, the barrier layer 206 can partly or completely cover the metallization layer 204. Furthermore, the barrier layer 206 can partly or completely cover the second region 202b of the substrate 202. In other words, the barrier layer 206 can laterally overlap the second region 202b of the substrate 202. The lateral direction is defined by the surface 202o of the substrate 202. The barrier layer 206 can be patterned, for example. In this case, the barrier layer 206 can be formed, e.g. deposited selectively, in such a way that it is arranged only above the metallization layer 204 and the second region 202b. Furthermore, the barrier layer 206 can be deposited above the entire substrate 202 and be removed again laterally outside the regions 202a, 202b.

Figure 2D:
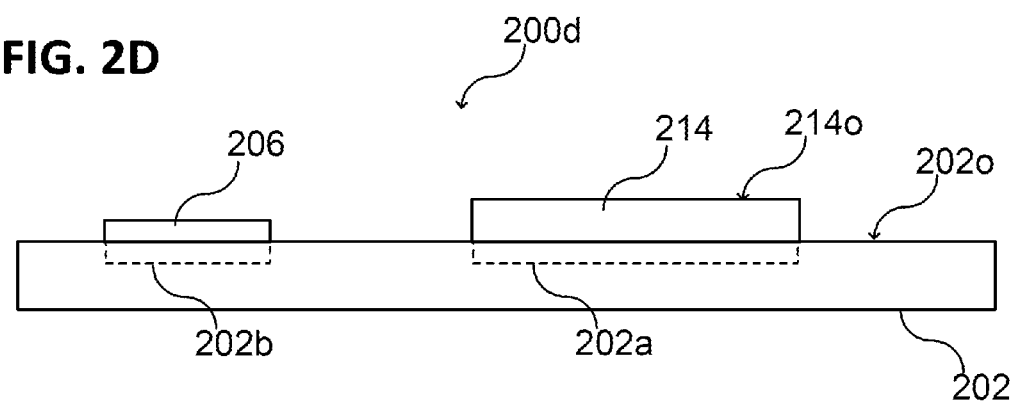

FIG. 2D illustrates the substrate 202 after the process of removing the barrier layer 206 in the first region 202a of the substrate 202 by means of drive-in of the barrier layer 206 into the metallization layer 204, in accordance with various embodiments.

By means of the drive-in of the barrier layer 206 into the metallization layer 204, the latter can be completely removed in the first region 202a. Illustratively, before the drive-in of the barrier layer 206, a surface 204o of the metallization layer 204 is covered with the barrier layer 206. After the drive-in of the barrier layer 206 a mixed metallization layer 214 is formed in the first region from the material of the metallization layer 204 and the material of the barrier layer 206, with a new surface 214o.

In accordance with various embodiments, the mixed metallization layer 214 can likewise function as a metallization layer, that is to say that the latter is correspondingly electrically conductive. Illustratively, the material of the barrier layer 206 can be taken up in the metallization layer 204, without the latter significantly reducing the electrical conductivity thereof. By way of example, the mixed metallization layer 214 may include a first material (a metal or a metal alloy) from the metallization layer 204 and furthermore a second material (e.g. silicon) from the barrier layer 206. The substance amount ratio of the second material to the first material ($n_2/n_1$) is less than approximately 1/100. In this case, said substance amount ratio can result from the layer thickness ratio of the barrier layer 206 to the metallization layer 204.

By way of example, the mixed metallization layer 214 may include aluminium from the metallization layer 204 and furthermore silicon from the barrier layer 206. The substance amount ratio of silicon to aluminium ($n_{Si}/n_{Al}$) is less than approximately 1/100.

In accordance with various embodiments, the uncovered surface 214o of the mixed metallization layer 214 can be electrically conductive, i.e. no longer covered by the barrier layer 206, and thus be electrically contacted. For electrical contacting, the uncovered surface 214o of the mixed metallization layer 214 can for example be additionally layered, e.g. with a seed layer, an adhesion promoting layer, etc., or be contacted directly by means of a bonding wire, cf. FIG. 6A and FIG. 6B.

After the drive-in of the barrier layer 206 into the metallization layer 204 in the first region 202a, the second region 202b of the substrate 202 can still be covered by the barrier layer 206. Illustratively, the substrate material, the material of the barrier layer 206 and the material of the metallization layer 204 can be selected in such a way that although the barrier layer 206 can be driven into the metallization layer 204, it is not driven into the substrate 202 in the process. By way of example, the substrate 202 may include or essentially consist of (e.g. monocrystalline or polycrystalline) silicon; the barrier layer 206 may include or essentially consist of amorphous silicon; and the metallization layer 204 may include or essentially consist of aluminium or an aluminium alloy.

Figure 3A:
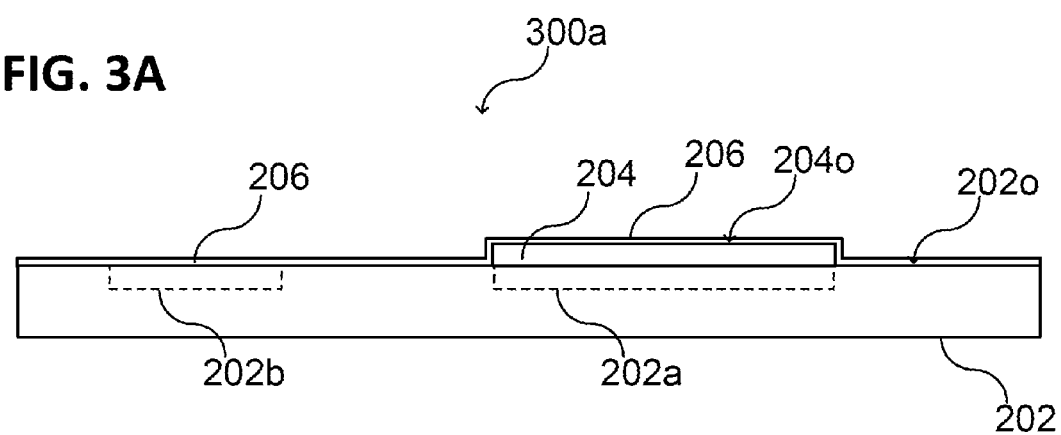
FIGS. 3A and 3B show in each case a schematic view of a substrate during the processing, in accordance with various embodiments.
Figure 3B:
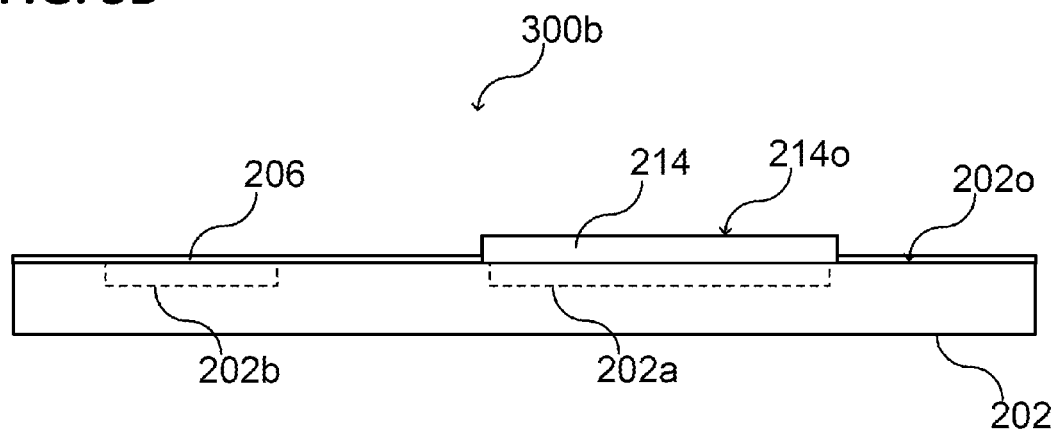

FIG. 3A and FIG. 3B illustrate in each case a schematic side view or cross-sectional view of a substrate at different points in time 300a, 300b during the processing, e.g. during the method 100, in accordance with various embodiments. In a manner analogous to that described above, the barrier layer 206, which, in accordance with various embodiments, can be formed after the metallization layer 204 has been formed, can be deposited above the entire substrate 202. Illustratively, by way of example, a conformal deposition process can be used for forming the barrier layer 206, e.g. Atomic Layer Deposition (ALD) or LPCVD (Low Pressure CVD), cathode sputtering, or the like.

After forming the metallization layer 204, by way of example, part of the surface 202o of the substrate 202 can be uncovered, e.g. at least in the second region 202b. Furthermore, the surface 204o of the metallization layer 204 can be uncovered. The uncovered surface 202o of the substrate 202 and the uncovered surface 204o of the metallization layer 204 can be covered completely with the barrier layer 206, as is illustrated in a schematic view in FIG. 3A. This has the consequence, for example, that a masking or patterning can be dispensed with in this process. Upon the subsequent drive-in of the barrier layer 206 into the metallization layer 204, see FIG. 3B, that part of the barrier layer 206 which has direct contact with the metallization layer 204 (e.g. in the first region 202a of the substrate 202) is removed. No masking or patterning is necessary for this purpose either. Illustratively, the removal of the barrier layer 206 above the metallization layer 204 is effected in a self-aligning manner on account of the drive-in of the barrier layer 206 into the metallization layer 204.

FIG. 4A to FIG. 4D illustrate in each case a schematic side view or cross-sectional view of a substrate 202 at different points in time 400a, 400b, 400c, 400d during the processing, e.g. during the method 100, in accordance with various embodiments. In a manner analogous to that described above, after forming the metallization layer 204 and the barrier layer 206 (cf. FIG. 2C and FIG. 3B), and before the drive-in of the barrier layer 206 into the metallization layer 204, it is possible to form a passivation layer 416 above the barrier layer 206, as is illustrated for example in FIG. 4A and FIG. 4B.

The passivation layer 416 can be formed, e.g. be applied by means of spin-coating or spray-coating, or be applied by any other suitable coating method, for example in such a way that the barrier layer 206 is completely covered. Afterwards, the passivation layer 416 can be patterned; e.g. the part of the passivation layer 416 above the metallization layer 204 (i.e. in the first region 202a of the substrate 202) can be removed, as is illustrated in FIG. 4C. A photolithographic process can be used for patterning the passivation layer 416. In this case, the barrier layer 206 can function as an antireflection layer. In accordance with various embodiments, it is possible to use an a-Si layer as barrier layer 206 having a layer thickness of less than 100 nm as an antireflection layer.

Figure 4A:
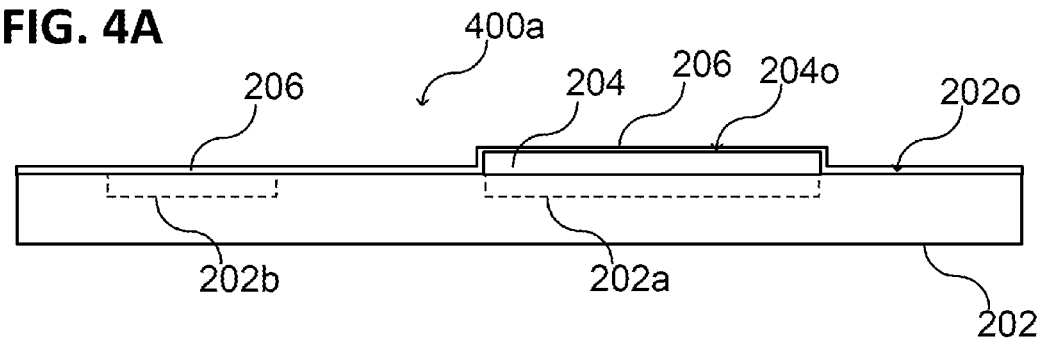
FIGS. 4A to 4D show in each case a schematic view of a substrate during the processing, in accordance with various embodiments.
Figure 4B:
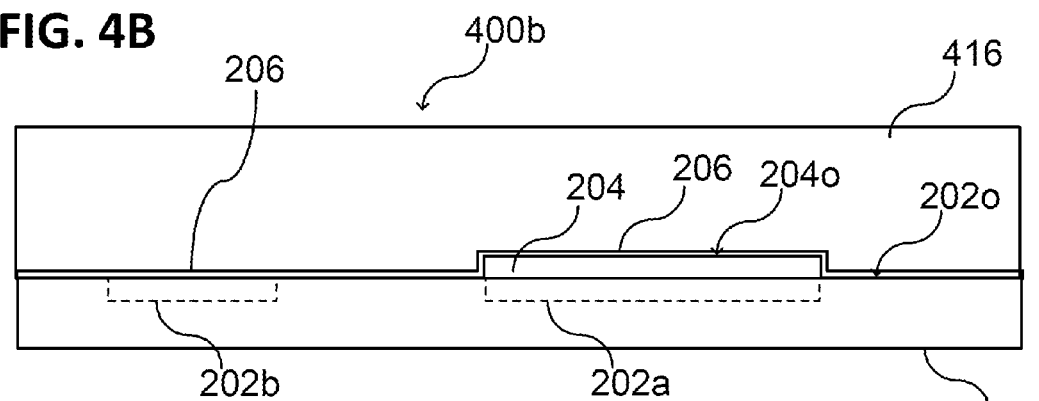
Figure 4C:
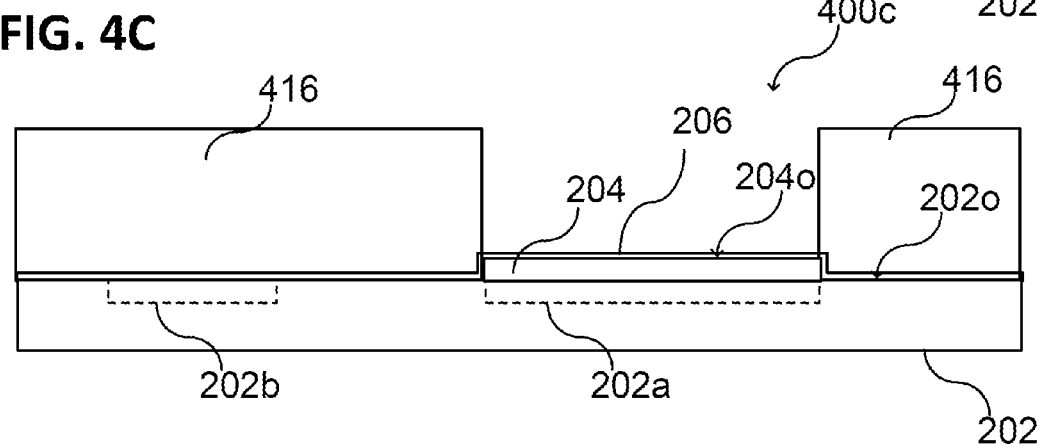
Figure 4D:
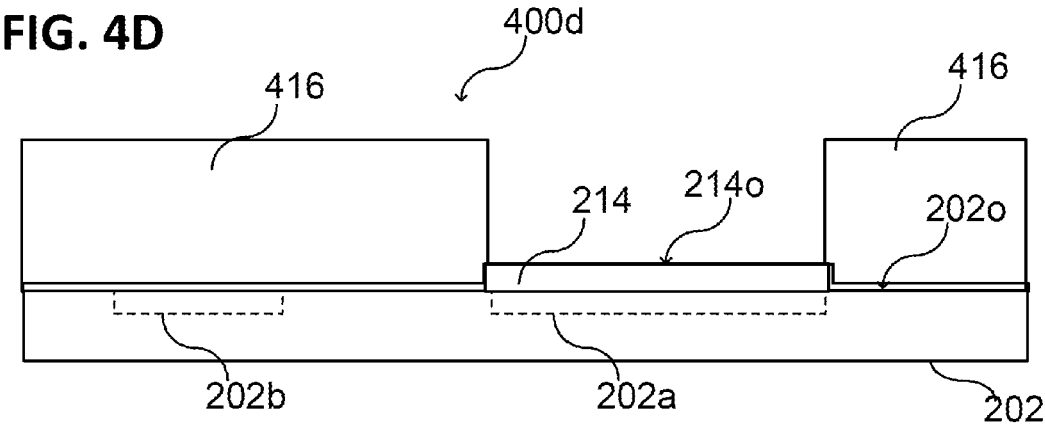

After the photolithographic method or after the exposure or after the patterning of the passivation layer 416, that section of the barrier layer 206 which is arranged above the metallization layer 204 can be removed by means of drive-in, as is illustrated in FIG. 4D.

The passivation layer 416 can be patterned in such a way that a surface 214 of the metallization layer 204 is uncovered after the drive-in and can be electrically contacted, for example.

In accordance with various embodiments, the passivation layer 416 may include at least one material from the following group of materials: an imide-containing material (e.g. polyimide), polybenzoxazol (PBO), benzocyclobutene (BCB), a siloxane-containing material, an epoxy-containing material, cycloethene, or other suitable polymers.

In accordance with various embodiments, the passivation layer 416 may include a photosensitive material and itself be patterned photolithographically, e.g. be exposed and developed. Alternatively, a mask can be used in order to pattern the passivation layer 416 for example by means of plasma etching or the like.

FIG. 5A and FIG. 5B illustrate in each case a schematic side view or cross-sectional view of a substrate 202 at different points in time 500a, 500b during the processing, e.g. during the method 100, in accordance with various embodiments. In this case, a diffusion barrier 508 (also referred to as diffusion barrier layer) is formed below the metallization layer 204.

In other words, before forming the metallization layer 204 in the first region 202a of the substrate 202 it is possible to form a diffusion barrier 508. The latter can for example prevent substrate material from passing into the metallization layer 204 during the later drive-in of the barrier layer 206 into the metallization layer 204. If, for example, the substrate 202 includes or essentially consists of silicon and a barrier layer 206 composed of amorphous silicon is intended to be driven into the metallization layer 204, for example without a diffusion barrier 508 substrate material could also be driven into the metallization layer 204 and influence the properties of the metallization layer 204, e.g. increase the roughness thereof and/or reduce the electrical conductivity thereof. In other words, the diffusion barrier 508 can be configured in such a way that it prevents or inhibits a diffusion of substrate material into the metallization layer 204.

The diffusion barrier 508 may include for example at least one material from the following group of materials: a metal, e.g. tantalum, tungsten, titanium, molybdenum, a metal or semimetal nitride, e.g. silicon nitride, tantalum nitride, tungsten nitride, titanium nitride, molybdenum nitride, and/or a metal or semimetal oxynitride, e.g. silicon oxynitride, tantalum oxynitride, tungsten oxynitride, titanium oxynitride, molybdenum oxynitride, or the like, e.g. a metal alloy having a high melting point. The diffusion barrier 508 can also include a combination of a plurality of the materials mentioned above. By way of example, the diffusion barrier 508 may include a layer stack including a plurality of layers arranged one above another. The respective layers may include in each case at least one of the materials mentioned above.

As is illustrated in FIG. 6A and FIG. 6B, the metallization layer 214 can be electrically contacted after the drive-in of the barrier layer 206 into said metallization layer. The contacting can be effected by means of bonding 600a, for example. In this case, at least one bonding wire 614d is secured on the uncovered surface 214o of the metallization layer 214.

By virtue of the fact that the surface 214o of the metallization layer 214 is not etched or influenced in some other way during the method described herein, it can be very smooth and/or free of defects. Consequently, for example, a bonding wire 614d bonded thereon can adhere very well to the surface 214o of the metallization layer 214. Furthermore, in addition, before contacting the metallization layer 214, it is possible to form an adhesion promoting layer on the surface 214o of the metallization layer 214 and subsequently to bond the bonding wire 614d onto the adhesion promoting layer (not illustrated).

Forming an adhesion promoting layer directly on the metallization layer 214 can be effected for example by means of electrolytic layering (so-called electroplating) or by means of chemical layering (e.g. electroless plating).

In accordance with various embodiments, the metallization layer 204 can be sealed or protected by means of the barrier layer 206 during the processing of the substrate 202. At a desired point in time, the barrier layer 206 can then be removed and an intact surface 214o of the metallization layer 214 can thus be provided. The barrier layer 206 can be removed for example directly before a surface-sensitive process, such as e-less plating, for example. Consequently, the metallization layer 204 can be protected during possible intermediate processes, e.g. etching of structures or the like. After the drive-in of the barrier layer 206, for example, a surface-sensitive process, e.g. e-less plating of the metallization layer 214, can thus be made possible or stabilized.

The drive-in of the barrier layer 206 into the metallization layer 204 may be necessary in order to electrically contact the metallization layer 204, since the barrier layer 206 is electrically insulating or at least less electrically conductive than the metallization layer 204.

As is illustrated in FIG. 2D, FIG. 3B, FIG. 4D and FIG. 6B, the barrier layer 206 can remain in the second region 202b of the substrate 202 or alongside the metallization layer 204 and function as a passivation layer or an additional passivation layer there.

FIG. 7A and FIG. 7B illustrate in each case a schematic side view or cross-sectional view of a substrate 202 to be processed, or a processed substrate 202, in accordance with various embodiments. By way of example, before forming the metallization layer 204, it possible to form a semiconductor structure 702 (e.g. a power semiconductor structure) in and/or on the substrate 202, as is illustrated in FIG. 7A.

A semiconductor structure 702 may include a logic structure, a memory structure, or the like.

A power semiconductor structure 702 may include or be for example a power transistor structure, a power diode structure, a thyristor structure, etc. FIG. 7B illustrates an IGBT (insulated gate bipolar transistor) structure by way of example.

In this case, the semiconductor structure 702 (or the power semiconductor structure 702) can define the two regions 202a, 202b of the substrate 202. The first region 202a of the substrate 202 can be for example a region in which the semiconductor structure 702 is to be electrically contacted. In other words, the semiconductor structure 702 may include at least one contact structure which is intended to be contacted by means of the metallization layer 204, 214.

As is illustrated in FIG. 7B, the metallization layer 204 can be formed in such a way that it electrically contacts the semiconductor structure 702 (or the power semiconductor structure 702) in a plurality of first regions 202a of the semiconductor substrate 202. In the remaining regions 202b of the substrate, i.e. for example laterally alongside the electrical contacts 712, 714, 716, 718 of the metallization layer 204, the barrier layer 206 is arranged, in accordance with the method described herein. Consequently, the substrate 202 includes a plurality of first regions 202a, above which the metallization layer 204 is arranged or above which the respective electrical contacts 712, 714, 716, 718 are arranged, and a plurality of second regions 202b, which are free of the metallization layer 204 and which are covered by the barrier layer 206.

In order to provide in each case a desired semiconductor structure 702 or power semiconductor structure 702, the substrate 202 can be correspondingly doped itself and furthermore include doped regions 720, 722, 724. As is illustrated in FIG. 7B, for example, the substrate 202 can be doped with a first doping type (p- or n-doped). Regions 720, 722, 724 having a second doping type (n or p-doped), which is different from the first doping type, can be formed in the substrate.

Illustratively, a source region 720 can be formed in the substrate 202. The metallization layer 204 has a source contact 712, which electrically contacts the source region 720. A gate structure 714g can be formed above the source region 720. The metallization layer 204 may have a gate contact 714, which electrically contacts the gate structure 714g. Furthermore, a drain region 724, e.g. in the form of a drain ring 724, can be formed in the substrate 202. The metallization layer 204 may have a drain contact 718, which electrically contacts the drain region 724.

Furthermore, it is possible to form an edge termination structure 722, e.g. a plurality of mutually separate regions 722, in the substrate 202, wherein the metallization layer 204 includes an edge termination contact structure 716, e.g. a plurality of mutually separate edge termination contacts 716, which electrically contacts the edge termination structure 722. The edge termination structure 722 can laterally surround the source region 720, for example, in a ring-shaped manner.

As is illustrated in FIG. 7B, an IGBT structure can be formed in and/or on the substrate. The IGBT structure includes in the substrate 202 correspondingly doped source/drain regions 720, 724 and also the gate structure 714g and an edge termination structure 722. In this case, the respective electrical contacts 712, 714, 716, 718 are configured as described above by way of example for the metallization layer 204. In accordance with various embodiments, each of the electrical contacts 712, 714, 716, 718 may include a diffusion barrier 508 and an aluminium-containing metallization layer 204 (in the form of a layer stack as metallization). The regions between or alongside the electrical contacts 712, 714, 716, 718 are covered by means of the barrier layer 206. That part of the barrier layer 206 which has covered the electrical contacts 712, 714, 716, 718 during the processing is driven into them, as described above.

In accordance with various embodiments, an insulating structure 726 can be formed on a sidewall of the substrate 202. This prevents for example an electrical short circuit between the front side 202o and a rear side of the substrate 202.

In accordance with various embodiments, a semiconductor component (for example an IGBT, cf. FIG. 7B) can be processed or produced by means of the method 100 described herein. In this case, the semiconductor component may include the following: a semiconductor substrate 202 including silicon, a metallization layer 204 including a plurality of electrical contacts for electrically contacting a semiconductor structure, formed in and/or on the substrate. Each of the plurality of electrical contacts includes aluminium and silicon (e.g. driven into the aluminium). At least one second region 202b of the semiconductor substrate 202 is free of the metallization layer 204; and a barrier layer 206 including amorphous silicon. The barrier layer 206 is arranged above the at least one second region 202b of the semiconductor substrate 202. In this case, the barrier layer 206 can cover every region of the substrate 202 which is not covered by the metallization layer 204 or which is not contacted by the electrical contacts of the metallization layer 204.

FIG. 8A to FIG. 8G illustrate in each case a schematic side view or cross-sectional view of a substrate 202 at different points in time 800a-800g during the processing 800a-800g, in accordance with various embodiments.

Figure 8A:
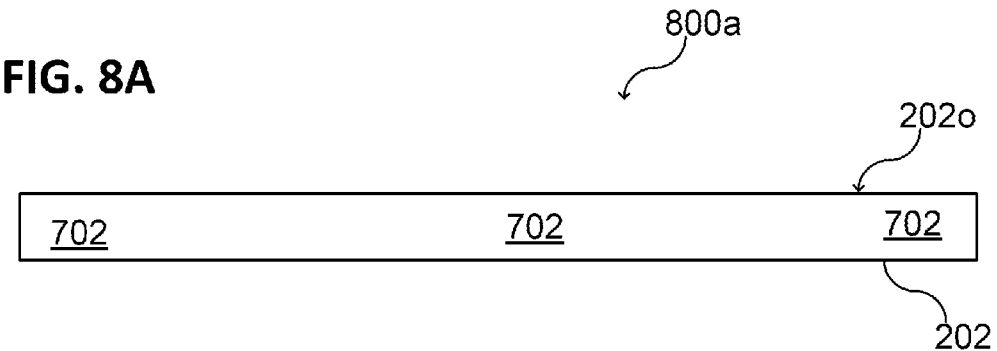
FIGS. 8A to 8G show in each case a schematic view of a substrate during the processing, in accordance with various embodiments.

FIG. 8A illustrates a substrate 202 at a first point in time 800a of the processing. The substrate 202 includes semiconductor material, for example. Illustratively, the substrate 202 can be a silicon wafer, silicon chip, or any other suitable semiconductor substrate. The semiconductor substrate 202 can have a surface 202o to be processed (also referred to as main surface or front side).

By way of example, at least one semiconductor structure 702, e.g. an IGBT structure or any other semiconductor structure as described above, can be formed in and/or on the substrate 202.

Figure 8B:
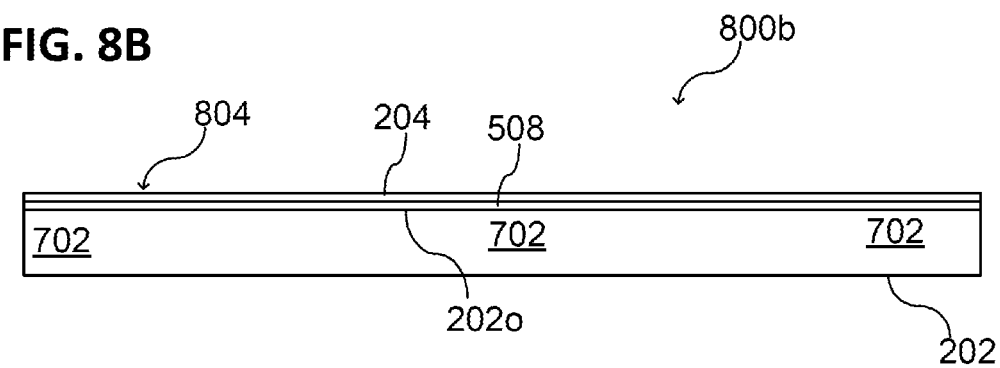

FIG. 8B illustrates the substrate 202 after the process of forming a layer stack 804 above the entire uncovered surface 202o of the substrate 202. The layer stack 804 may include an electrically conductive diffusion barrier 508 and the metallization layer 204, in accordance with various embodiments. Alternatively, instead of the layer stack 804, it is also possible for only an individual metallization layer 204 to be applied on the substrate. The diffusion barrier 508 can also be regarded as part of the metallization since the latter is electrically conductive, such that the layer stack 804 can also be regarded as metallization.

The metallization 804 can electrically contact the semiconductor structure 702. As described above, the metallization 804 may include a metallization layer 204. The metallization layer 204 may include aluminium or an aluminium/copper alloy.

Figure 8C:
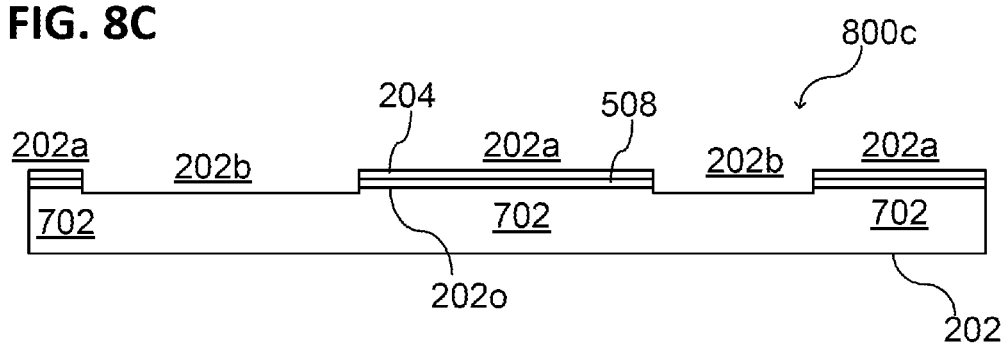

As is illustrated in FIG. 8C, the metallization 804 can be patterned, in accordance with various embodiments, cf. FIG. 5B. In this case, the patterning is effected in such a way that the metallization 804 covers a plurality of first regions 202a of the substrate 202. A plurality of second regions 202b of the substrate 202 are uncovered. Illustratively, the metallization 804 in the plurality of first regions 202a has a direct physical and electrical contact with the substrate 202. The plurality of second regions 202b of the substrate 202 have no direct physical and electrical contact with the metallization 804.

The first regions 202a and the second regions 202b of the substrate 202 are defined for example by the semiconductor structure 702 to be electrically contacted.

Figure 8D:
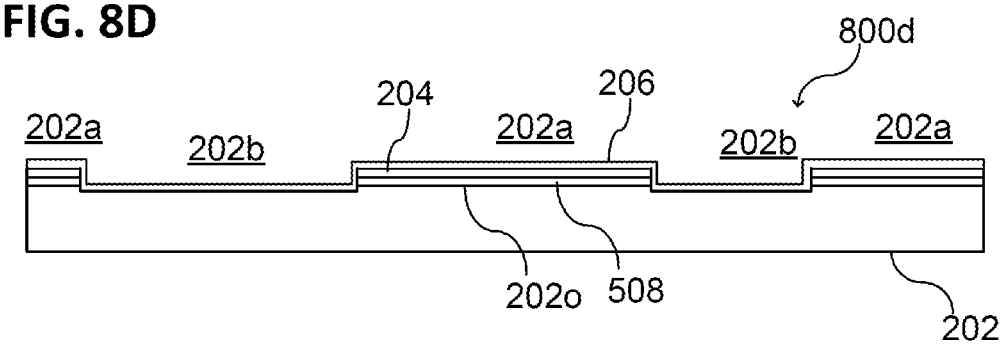

As is illustrated in FIG. 8D, a barrier layer 206 can be formed above the metallization 804. The barrier layer 206 can have a direct physical contact with the metallization layer 204, such that the barrier layer 206 can be driven into the latter. In the plurality of second regions 202b, the barrier layer 206 can be formed directly on the substrate 202.

Starting from this point in time 800d, the barrier layer 206 protects for example the underlying structures during the further processing.

Figure 8E:
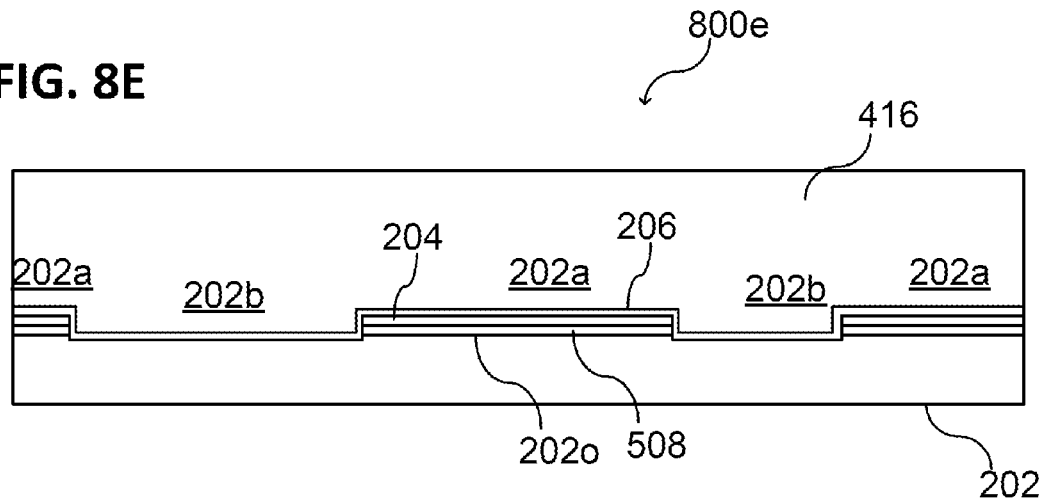
Figure 8F:
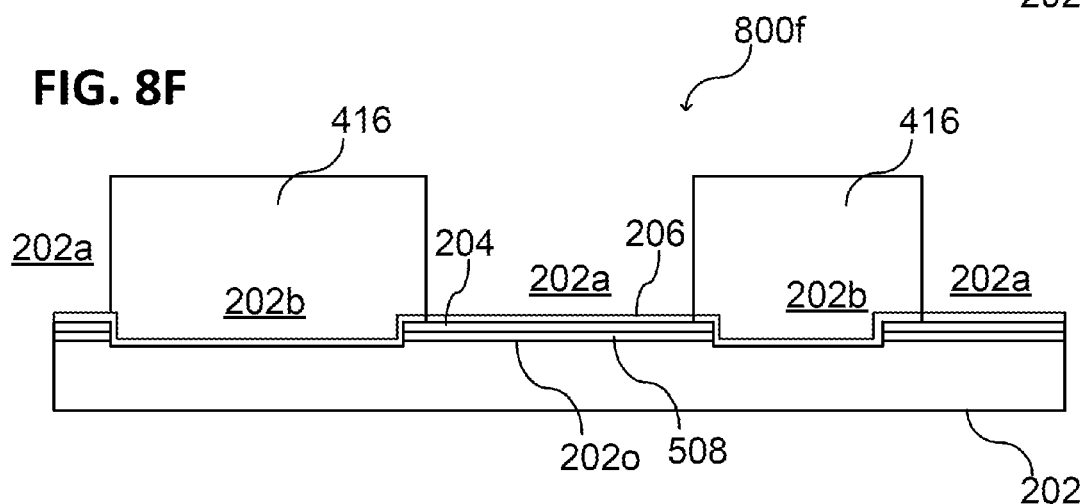

As is illustrated in FIG. 8E, at least one passivation layer 416 can be formed above the barrier layer 206, cf. FIG. 4B. This can then be patterned, also with the aid of the barrier layer 206, which can serve as an antireflection layer, as is illustrated in FIG. 8F, cf. FIG. 4C.

The passivation layer 416 can be patterned in such a way that the barrier layer 206 is uncovered in the plurality of first regions 202a of the substrate 202.

Figure 8G:
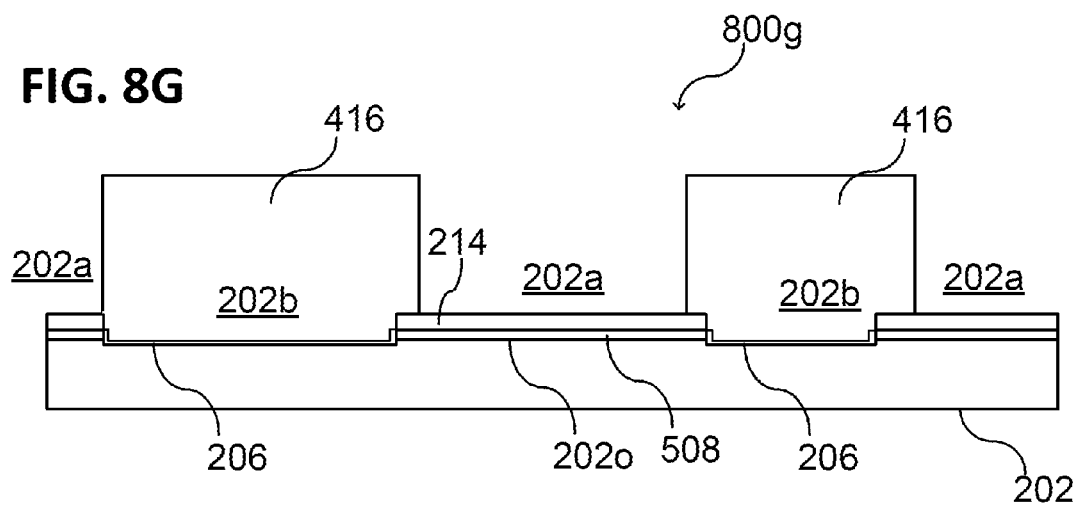

Afterwards, the barrier layer 206 can be partly removed by means of drive-in of the barrier layer 206 into the metallization layer 204; e.g. the barrier layer 206 is removed in the plurality of first regions 202a of the substrate 202, such that these can be electrically contacted, as is illustrated in FIG. 8G, cf. FIG. 4D.

By means of the drive-in of the barrier layer 206 into the metallization layer 204, the latter can be completely removed in the plurality of first regions 202a. Illustratively, before the drive-in, a surface 204o of the metallization layer 204 is covered with the barrier layer 206, wherein after the drive-in a mixed metallization layer 214 is formed from the metallization layer 204 and the barrier layer 206, with a new surface 214o.

In accordance with various embodiments, a semiconductor component (for example an IGBT, cf. FIG. 8G) can be processed or produced by means of the method described herein. In this case, the semiconductor component may include the following: a semiconductor substrate 202 including silicon, a metallization layer 204 including aluminium and silicon (e.g. driven into the aluminium). The metallization layer 204 is arranged above a first region 202a of the semiconductor substrate 202. At least one second region 202b of the semiconductor substrate 202 is free of the metallization layer 204. The semiconductor component may further include a diffusion barrier 508, which is arranged between the semiconductor substrate 202 and the metallization layer 204; and a barrier layer 206 including amorphous silicon. The barrier layer 206 is arranged above the at least one second region 202b of the semiconductor substrate 202.

Example 1 is a method, including: forming a metallization layer above at least one first region of a substrate, wherein after forming the metallization layer at least one second region of the substrate is free of the metallization layer; forming a barrier layer above the at least one first region of the substrate and above the at least one second region of the substrate, wherein the barrier layer in the at least one first region of the substrate directly adjoins the metallization layer; and removing the barrier layer in the at least one first region of the substrate by means of drive-in of the barrier layer into the metallization layer. In this case, the barrier layer can be formed on the metallization layer, or in other words forming the barrier layer can be effected in such a way that the metallization layer is arranged between the barrier layer and the substrate.

In Example 2, the method according to Example 1 can furthermore optionally include, for example, before removing the barrier layer: forming a passivation layer above the barrier layer.

In Example 3, the method according to Example 2 can furthermore optionally include, for example, before removing the barrier layer: patterning the passivation layer.

In Example 4, the method according to Example 3 can optionally include, for example, the fact that patterning the passivation layer is effected by means of photolithography, and the fact that the barrier layer is configured as an antireflection layer. To that end, the barrier layer can be arranged on the metallization layer.

In Example 5, the method according to Example 3 or 4 can optionally include, for example, the fact that patterning the passivation layer is effected in such a way that the latter is removed in the at least one first region of the substrate and the barrier layer is uncovered.

In Example 6, the method according to any of Examples 1 to 5 can furthermore optionally include, for example, after removing the barrier layer: contacting the metallization layer in the at least one first region of the substrate.

In Example 7, the method according to Example 6 can optionally include, for example, the fact that contacting the metallization layer is effected by means of bonding a bonding wire onto the metallization layer.

In Example 8, the method according to Example 6 or 7 can furthermore optionally include, for example, after removing the barrier layer and before contacting the metallization layer: forming an adhesion promoting layer on the metallization layer for contacting the metallization layer. The adhesion promoting layer can be electrically conductive and include or consist of nickel, palladium, gold, for example. Alternatively, the electrically conductive adhesion promoting layer may include or consist of some other metal or a metal alloy.

In Example 9, the method according to Example 8 can optionally include, for example, the fact that forming the electrically conductive adhesion promoting layer is effected by means of electrolytic layering (e.g. electroplating) or chemical layering (e.g. electroless plating).

In Example 10, the method according to any of Examples 1 to 9 can furthermore optionally include, for example, before forming the metallization layer: forming a power semiconductor structure in and/or on the substrate. In this case, the power semiconductor structure can be an IGBT structure.

In Example 11, the method according to any of Examples 1 to 10 can optionally include, for example, the fact that the drive-in of the barrier layer into the metallization layer is effected by means of an annealing process.

In Example 12, the method according to any of Examples 1 to 11 can optionally include, for example, the fact that forming the barrier layer is effected by means of depositing the barrier layer using a chemical or physical deposition process at a predefined deposition temperature.

In Example 13, the method according to Example 12 can optionally include, for example, the fact that materials of the metallization layer and the barrier layer and also the deposition temperature are chosen in such a way that the material of the barrier layer mixes with the material of the metallization layer substantially only above the deposition temperature.

In Example 14, the method according to any of Examples 1 to 13 can optionally include, for example, the fact that the barrier layer includes or essentially consists of electrically insulating material.

In Example 15, the method according to any of Examples 1 to 14 can optionally include, for example, the fact that the barrier layer includes or consists of amorphous silicon.

In Example 16, the method according to any of Examples 1 to 15 can optionally include, for example, the fact that forming the barrier layer is effected by means of depositing amorphous silicon using a chemical or physical deposition process at a deposition temperature of less than 200° C.

In Example 17, the method according to any of Examples 1 to 16 can optionally include, for example, the fact that the metallization layer includes or consists of aluminium.

In Example 18, the method according to Examples 16 and 17 can optionally include, for example, the fact that the drive-in of the silicon from the barrier layer into the aluminium of the metallization layer is effected at a temperature of more than 200° C.

In Example 19, the method according to any of Examples 1 to 18 can optionally include, for example, the fact that the substrate includes or consists of a semiconductor material. The semiconductor material can be silicon, for example.

In Example 20, the method according to any of Examples 1 to 19 can optionally include, for example: forming a diffusion barrier between the metallization layer and the substrate. The diffusion barrier can be electrically conductive.

In Example 21, the method according to any of Examples 1 to 20 can optionally include, for example, the fact that the barrier layer has a layer thickness of less than 100 nm.

In Example 22, the method according to any of Examples 1 to 21 can optionally include, for example, the fact that the metallization layer has a layer thickness of more than 500 nm. Furthermore, the metallization layer can have a layer thickness of more than 1 µm, e.g. a layer thickness in a range of approximately 1 µm to approximately 5 µm. Consequently, by way of example, it is possible to electrically contact a power semiconductor structure in the semiconductor substrate.

In Example 23, the method according to any of Examples 1 to 22 can optionally include, for example, the fact that the barrier layer has a layer thickness which is less than the layer thickness of the metallization layer.

Example 24 is a semiconductor component produced by means of the method according to any of Examples 1 to 23.

Example 25 is a semiconductor component, including: a semiconductor substrate including silicon, a metallization layer including aluminium and silicon, wherein the metallization layer is arranged above a first region of the semiconductor substrate, and wherein at least one second region of the semiconductor substrate is free of the metallization layer; a diffusion barrier, which is arranged between the semiconductor substrate and the metallization layer; and a barrier layer including amorphous silicon, wherein the barrier layer is arranged above the at least one second region of the semiconductor substrate.

Example 26 is a method, including: forming a metallization including at least one metallization layer above at least one first region of a substrate, wherein after forming the metallization at least one second region of the substrate is free of the metallization; forming a barrier layer above the at least one first region of the substrate and above the at least one second region of the substrate, wherein the barrier layer in the at least one first region of the substrate directly adjoins the metallization layer; and removing the barrier layer in the at least one first region of the substrate by means of drive-in of the barrier layer into the metallization layer. In this way, the barrier layer can be formed on the metallization layer, or in other words forming the barrier layer can be effected in such a way that the metallization layer is arranged between the barrier layer and the substrate.

Example 27 is a semiconductor component, including: a semiconductor substrate including silicon, a metallization including at least one metallization layer and a diffusion barrier layer, wherein the metallization is arranged above a first region of the semiconductor substrate, and wherein at least one second region of the semiconductor substrate is free of the metallization, wherein the metallization layer includes aluminium and silicon, and wherein the diffusion barrier layer is arranged between the semiconductor substrate and the metallization layer, and a barrier layer including amorphous silicon, wherein the barrier layer is arranged above the at least one second region of the semiconductor substrate.

The diffusion barrier layer can be configured to completely separate the metallization layer from the semiconductor substrate, such that the metallization layer has electrical contact with the semiconductor substrate, but is physically separated from the semiconductor substrate.

The metallization layer may include a material suitable for taking up a predefined amount of the material of the barrier layer. By way of example, aluminium can take up a certain amount of silicon.

Example 28 is a method for passivating a silicon substrate, the method including: forming a metallization including at least one metallization layer above at least one first region of the silicon substrate, wherein after forming the metallization at least one second region of the silicon substrate is free of the metallization; forming a barrier layer above the at least one first region of the substrate and above the at least one second region of the substrate, wherein the barrier layer in the at least one first region of the substrate directly adjoins the metallization layer; forming a passivation layer above the barrier layer; patterning the passivation layer and in the process uncovering the barrier layer in the at least one first region; removing the barrier layer in the at least one first region of the substrate by means of drive-in of the barrier layer into the metallization layer; and, afterwards, electrically contacting the metallization layer. In this case, the barrier layer can be formed on the metallization layer, or in other words forming the barrier layer can be effected in such a way that the metallization layer is arranged between the barrier layer and the substrate.

In accordance with various embodiments, during the drive-in of the barrier layer into the metallization layer, a patterned passivation layer that was formed above the barrier layer 206, cf. FIG. 4D, for example, can simultaneously be annealed. The passivation layer can for example be applied by means of spin-coating and be patterned by means of a lithography process.

In accordance with various embodiments, the diffusion barrier may include an alloy, e.g. AlSiCu or TiW. In accordance with various embodiments, it is possible to use a metallization including a metal heterostructure, e.g. a layer stack consisting of a first layer and a second layer arranged on the first layer. The first layer may include or consist of AlSiCu alloy or TiW alloy (e.g. as a diffusion barrier with respect to a silicon-containing substrate) and the second layer may include or consist of aluminium or an Al/Cu alloy. The metallization, e.g. the layer stack including diffusion barrier and metallization layer or only the metallization layer, can be patterned by means of lithography and wet-chemical etching.

In accordance with various embodiments, the metallization layer may include material of the barrier layer after the drive-in, which can be measured for example by means of EDX (energy-dispersive X-ray spectroscopy) or SIMS (secondary ion mass spectrometry).

In accordance with various embodiments, the barrier layer may include amorphous silicon which is partly driven into the patterned metallization layer, i.e. illustratively is removed in a self-aligned manner. The remaining part of the barrier layer can be electrically insulating before and after the drive-in. Illustratively, after the drive-in, part of the amorphous silicon can remain on the substrate, e.g. laterally between in each case two mutually adjacent regions of the metallization layer.

As described above, a diffusion barrier 508 can be used in order to protect the metallization layer 204 against the indiffusion of material from an underlying layer (e.g. from an underlying substrate, e.g. a silicon substrate). In this case, the metallization layer, before the drive-in of the barrier layer 206, may include pure aluminium or pure aluminium/copper, i.e. illustratively can for example be free of the material of the barrier layer 206 (e.g. silicon). After the drive-in of the barrier layer 206 into the metallization layer 204, the latter then correspondingly includes the material of the barrier layer 206 (e.g. silicon).

In accordance with various embodiments, a method is provided in which a layer is (partly) removed in a patterned manner by said layer being driven into a directly adjoining patterned further layer.

In accordance with various embodiments, a method (e.g. for processing a substrate) may include the following: forming a metallization layer above at least one first region of a substrate, wherein after forming the metallization layer at least one second region of the substrate is free of the metallization layer; forming a barrier layer above the at least one first region of the substrate and above the at least one second region of the substrate, wherein the barrier layer in the at least one first region of the substrate directly adjoins the metallization layer; and removing the barrier layer in the at least one first region of the substrate by means of drive-in of the barrier layer into the metallization layer.

In accordance with various embodiments, a method (e.g. for processing a substrate) may include the following: forming a metallization layer above at least one first region of a substrate, wherein after forming the metallization layer at least one second region of the substrate is free of the metallization layer; forming a barrier layer above the metallization layer and above the at least one second region of the substrate; and removing the barrier layer in the at least one first region of the substrate by means of drive-in of the barrier layer into the metallization layer.

The drive-in described herein can be understood as dissolving, dissociating, mixing or the like. By way of example, a material (referred to chemically as substance) can diffuse into a further material, dissolved in a further material or mix therewith. In this case, by way of example, it is possible to form a solid solution from the two materials, also referred to as interstitial solid solution or substitutional solid solution. Furthermore, it is possible to form a chemical compound from the two materials, e.g. an intermetallic component (also referred to as intermetallic phase). Furthermore, crystallites of a material can also be embedded into a further material.

In accordance with various embodiments, a semiconductor component may include the following: a semiconductor substrate including silicon, a metallization layer including aluminium and silicon, wherein the metallization layer is arranged above a first region of the semiconductor substrate, and wherein at least one second region of the semiconductor substrate is free of the metallization layer; a diffusion barrier, which is arranged between the semiconductor substrate and the metallization layer; and a barrier layer including amorphous silicon, wherein the barrier layer is arranged above the at least one second region of the semiconductor substrate.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method, comprising:
forming a metallization layer above at least one first region of a substrate, wherein after forming the metallization layer at least one second region of the substrate is free of the metallization layer, and wherein the metallization layer comprises or essentially consists of aluminum; and
forming a barrier layer above the at least one first region of the substrate and above the at least one second region of the substrate, wherein the barrier layer in the at least one first region of the substrate directly adjoins the metallization layer, and wherein the barrier layer comprises or essentially consists of amorphous silicon; and
removing the barrier layer in the at least one first region of the substrate by drive-in of the barrier layer into the metallization layer.

2. The method of claim 1, further comprising:
before removing the barrier layer, forming a passivation layer above the barrier layer.

3. The method of claim 2, further comprising:
before removing the barrier layer, patterning the passivation layer by photolithography.

4. The method of claim 1, further comprising:
after removing the barrier layer, contacting the metallization layer in the first region of the substrate.

5. The method of claim 4, further comprising:
after removing the barrier layer and before contacting the metallization layer, forming at least one of an electrically conductive adhesion promoting layer or an electrically conductive seed layer on the metallization layer for contacting the metallization layer.

6. The method of claim 1, further comprising:
before forming the metallization layer, forming a power semiconductor structure at least one of in or on the substrate.

7. The method of claim 1,
wherein the barrier layer comprises or essentially consists of electrically insulating material.

8. The method of claim 1,
wherein the barrier layer has a layer thickness of less than 100 nm.

9. The method of claim 1,
wherein the barrier layer has a layer thickness which is smaller than the layer thickness of the metallization layer.

10. The method of claim 1, further comprising:
before forming the metallization layer, forming an electrically conductive diffusion barrier over the first region of the substrate, wherein the metallization layer is formed over the electrically conductive diffusion barrier.

11. The method of claim 1, further comprising:
wherein, in the at least one second region, the barrier layer is formed directly on the substrate.

12. A semiconductor component, comprising:
a semiconductor substrate comprising silicon,
a metallization layer comprising aluminium and silicon, wherein the metallization layer is arranged above at least one first region of the semiconductor substrate, and wherein at least one second region of the semiconductor substrate is free of the metallization layer;

an electrically conductive diffusion barrier, which is arranged between the semiconductor substrate and the metallization layer; and a barrier layer comprising amorphous silicon, wherein the barrier layer is arranged over the at least one second region of the semiconductor substrate.

13. The semiconductor component of claim 12, wherein the electrically conductive diffusion barrier is disposed directly on the semiconductor substrate.

14. The semiconductor component of claim 12, wherein a substance amount ratio of silicon to aluminum in the metallization layer is less than approximately 1/100.

15. The semiconductor component of claim 12, wherein the barrier layer is disposed directly on the semiconductor substrate.

* * * * *